(12) United States Patent
DeCusatis

(10) Patent No.: US 6,512,179 B1
(45) Date of Patent: Jan. 28, 2003

(54) TRANSMISSION CABLE STRAIN RELIEF DEVICE

(75) Inventor: Casimer M. DeCusatis, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/966,231

(22) Filed: Sep. 28, 2001

(51) Int. Cl.[7] .......................... G02B 6/00; H01R 13/58
(52) U.S. Cl. .................. 174/135; 385/137; 361/826; 439/942
(58) Field of Search .................. 174/60, 72 A, 174/72 R, 135; 385/134, 135, 136, 137; 439/942; 248/68.1, 69, 73; 361/826, 827, 828; 24/531

(56) References Cited

U.S. PATENT DOCUMENTS

| | | | |
|---|---|---|---|
| 4,747,785 A | 5/1988 | Roberts et al. | |
| 5,007,858 A | 4/1991 | Daly et al. | |
| 5,073,127 A | 12/1991 | Daly et al. | |
| 5,115,260 A | * 5/1992 | Hayward et al. | ............ 174/255 |
| 5,515,472 A | * 5/1996 | Mullaney et al. | ............ 385/135 |
| 5,530,786 A | * 6/1996 | Radliff et al. | ............... 385/136 |
| 5,566,268 A | * 10/1996 | Radliff et al. | ............... 385/114 |
| 5,566,269 A | 10/1996 | Eberle, Jr. et al. | |
| 5,626,491 A | 5/1997 | Hasircoglu | |
| 5,831,216 A | 11/1998 | Hoffmann | |
| 5,990,420 A | * 11/1999 | Alexander | .................. 174/135 |
| 6,184,474 B1 | * 2/2001 | Craft, Jr. | ..................... 174/135 |
| 6,247,850 B1 | * 6/2001 | Edwards et al. | ............ 385/137 |

* cited by examiner

Primary Examiner—Dean A. Reichard
Assistant Examiner—Adolfo Nino
(74) Attorney, Agent, or Firm—Floyd A. Gonzalez; Cantor Colburn LLP

(57) ABSTRACT

A cable strain relief device is provided and includes a first support structure, the first support structure having a first support length, a first support width and a first support height and wherein the first support structure includes at least one first support channel for receiving at least one transmission cable, a second support structure, the second support structure having a second support length, a second support width and a second support height and wherein the second support structure includes at least one second support channel for receiving at least one transmission cable and a mounting device, the mounting device having a first side, a second side, a mounting device front, a mounting device rear, a mounting device top and a mounting device bottom, wherein the first support structure is disposed adjacent the first side and wherein the second support structure is disposed adjacent the second side.

20 Claims, 7 Drawing Sheets

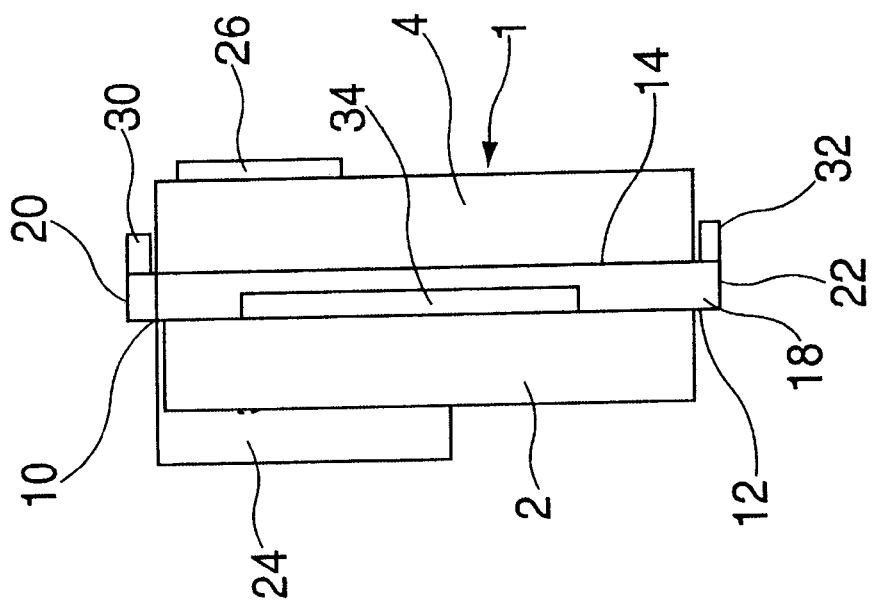
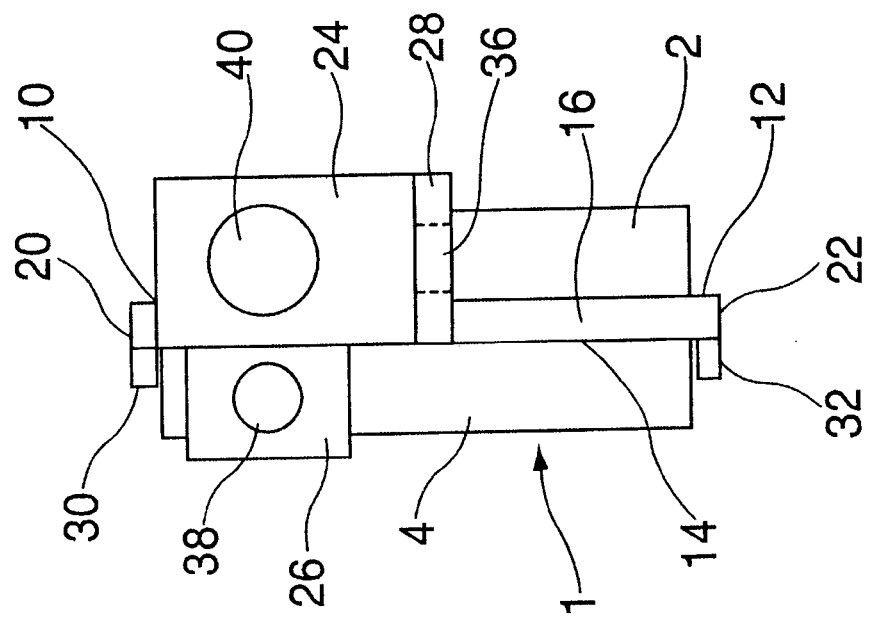

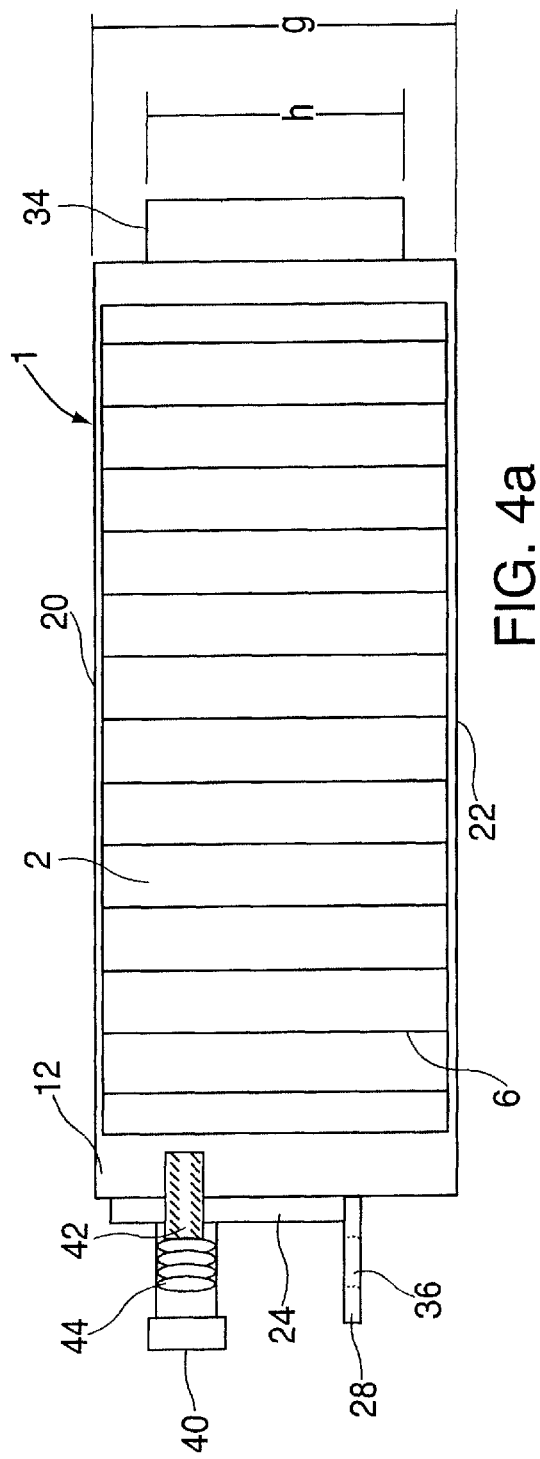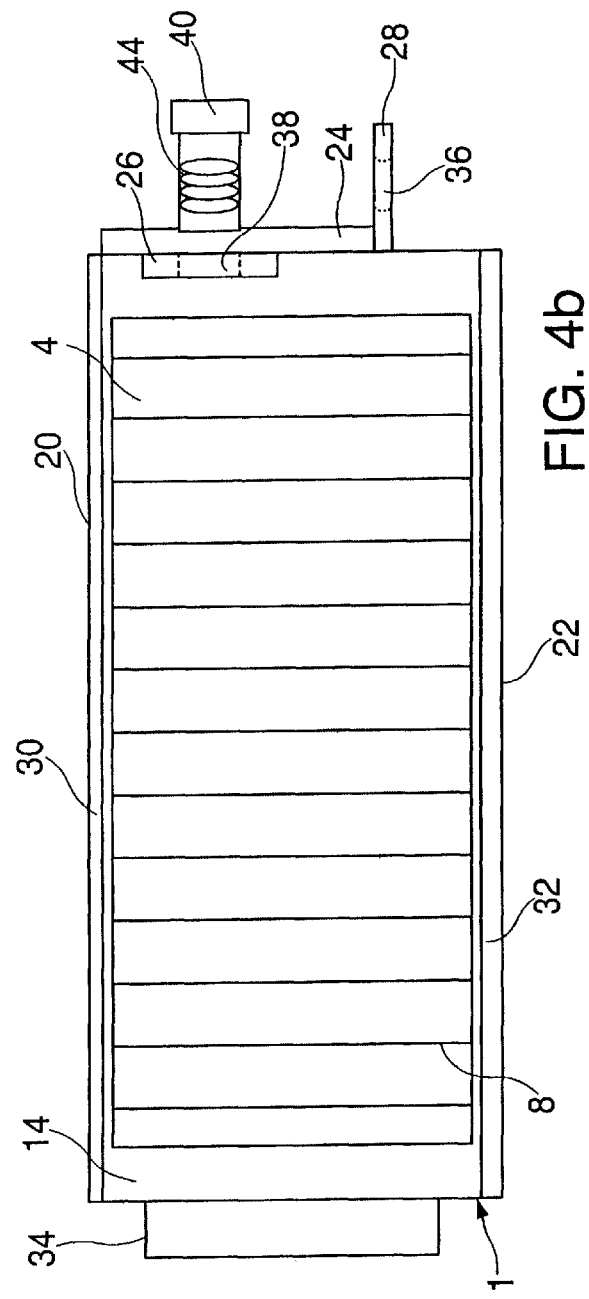

TRANSMISSION CABLE STRAIN RELIEF DEVICE

FIELD OF THE INVENTION

The present invention relates generally to a transmission cable strain relief device for minimizing strain forces transmitted to a transmission cable connection via a cable, and more particularly to a fiber optic cable strain relief for a small form factor fiber optic cable for minimizing any strain forces transmitted to an optical fiber connection via a small form factor fiber optic cable.

BACKGROUND OF THE INVENTION

Fiber optic cables and fiber optic connectors are well known in the art and are used extensively on various types of communication systems and computer systems, such as network servers, storage devices, switches, routers and hubs. This fiber optic interface typically allows for the rapid transfer of information via a high speed, high quality optical signal. However, if the fiber optic cable is pulled and a force is transmitted to the fiber optic connector via the fiber optic cable then the fiber optic cable may become partially disengaged from the fiber optic connector or in extreme cases, the fiber optic connector or the fiber optic signal processing card may experience mechanical damage. Either one of these circumstances could cause a degradation of the optical signal resulting in high signal losses and bit errors or a complete termination of the optical signal resulting in a total transmission failure.

Typically, in order to prevent the fiber optic cable and the fiber optic connector from disengaging or becoming damaged some form of protection, or strain relief, between the fiber optic cable and the fiber optic connector is provided. Current strain relief designs are based on serpentine or S-shaped grooves embedded into a plastic case or housing and are capable of absorbing a large amount of force. However, these designs are expensive, bulky, can only be used with a small number of fiber optic cables and are difficult to use. This is because each fiber optic cable must be threaded through the strain relief individually making the insertion or removal of these fiber optic cables from the strain relief difficult and cumbersome.

Also, most systems are housed in equipment support cabinets or racks that have equipment frame cutouts to dress other equipment cables, such as power cords and other types of cabling. However, because these equipment frame cutouts are not designed to be compatible with current transmission cable strain relief devices, a large number of systems don't adequately employ any transmission cable strain relief devices and are thus susceptible to damage from axial and non-axial pull forces.

In addition, a smaller optical interface approximately half the size of the current optical interface is presently being adopted by the fiber optic industry and is becoming more commonplace. This smaller optical interface utilizes new Small Form Factor (SFF) optical connectors and transceivers which, because of its smaller size may be more susceptible to strain and pull force problems than current optical interfaces. Likewise, the fiber optic cables used for the SFF optical connectors are thinner than current fiber optic cables and because of their smaller size they do not fit properly into current strain relief designs. Furthermore, because the SFF optical connectors use an RJ-45 type latch on only one side of the connector body, as opposed to current optical connectors which uses two latches on both sides of the connector, the SFF optical connectors are mechanically weaker and more prone to disengagement under high pull forces and off-axis pull forces in directions not protected by the latching mechanism.

In light of the above discussion, the need remains for a new type of transmission cable strain relief device that can be integrated with current equipment frame cutouts used to dress equipment cables and which is less expensive and easier to use than current strain relief devices. In addition, a further need remains for a new type of transmission cable strain relief device that can be used with existing copper cable designs, existing fiber optic cable designs and SFF fiber optic cable designs.

SUMMARY OF THE INVENTION

An embodiment of the invention is a cable strain relief device comprising: a first support structure, the first support structure having a first support length, a first support width and a first support height and wherein the first support structure includes at least one first support channel for receiving at least one transmission cable; a second support structure, the second support structure having a second support length, a second support width and a second support height and wherein the second support structure includes at least one second support channel for receiving at least one transmission cable; and a mounting device, the mounting device having a first side, a second side, a mounting device front, a mounting device rear, a mounting device top and a mounting device bottom, wherein the first support structure is disposed adjacent the first side and wherein the second support structure is adjacent the second side.

BRIEF DESCRIPTION OF THE DRAWINGS

FIG. 3a is a front view of a mounting device in accordance with an embodiment of the invention;

FIG. 3b is a rear view of a mounting device in accordance with an embodiment of the invention;

FIG. 4a is a side view of a transmission cable strain relief device showing the first side in accordance with an embodiment of the invention;

FIG. 4b is a side view of a transmission cable strain relief device showing the second side in accordance with an embodiment of the invention;

DETAILED DESCRIPTION OF THE INVENTION

Figure 1A:
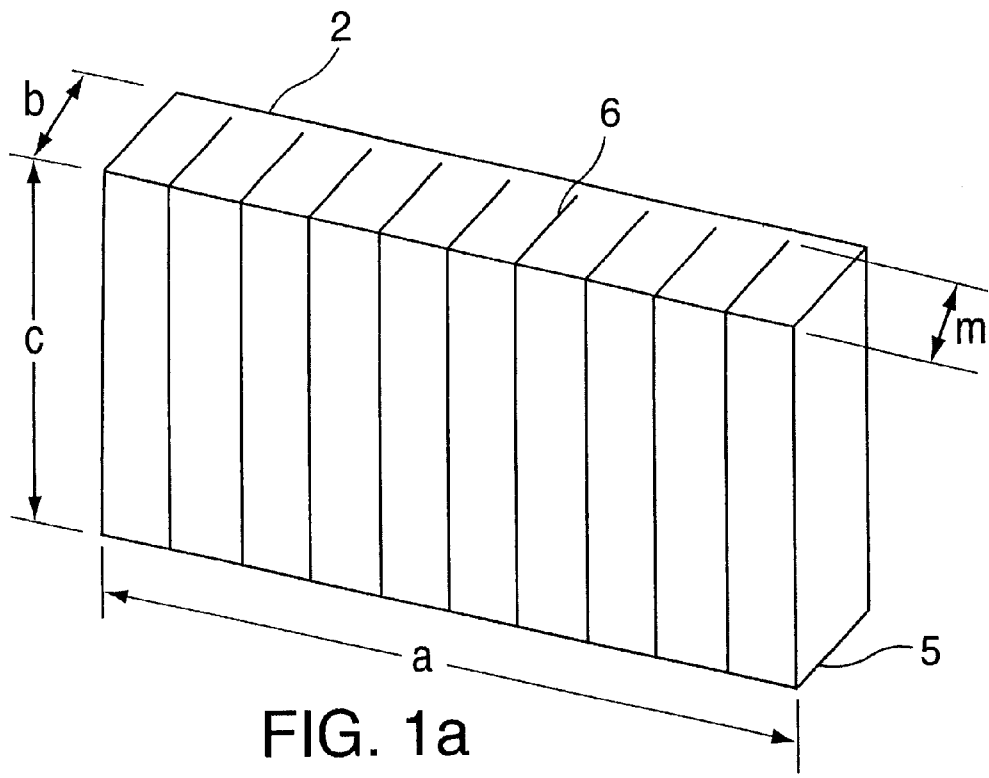
FIG. 1a is a perspective view of a first support structure showing a plurality of first support channels in accordance with an embodiment of the invention.
Figure 1B:
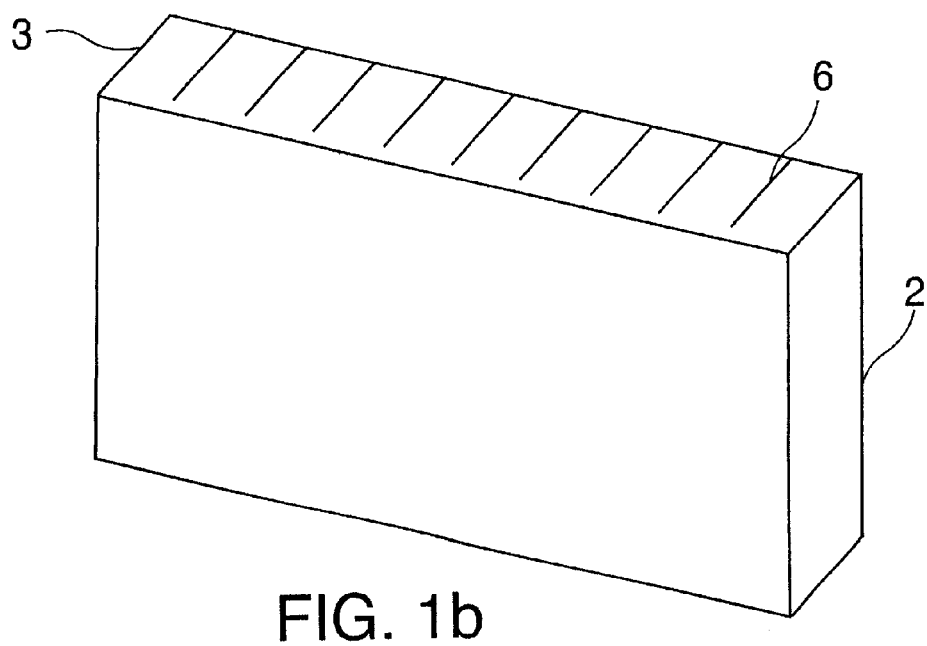
FIG. 1b is a perspective view of a first support structure in accordance with an embodiment of the invention.
Figure 2A:
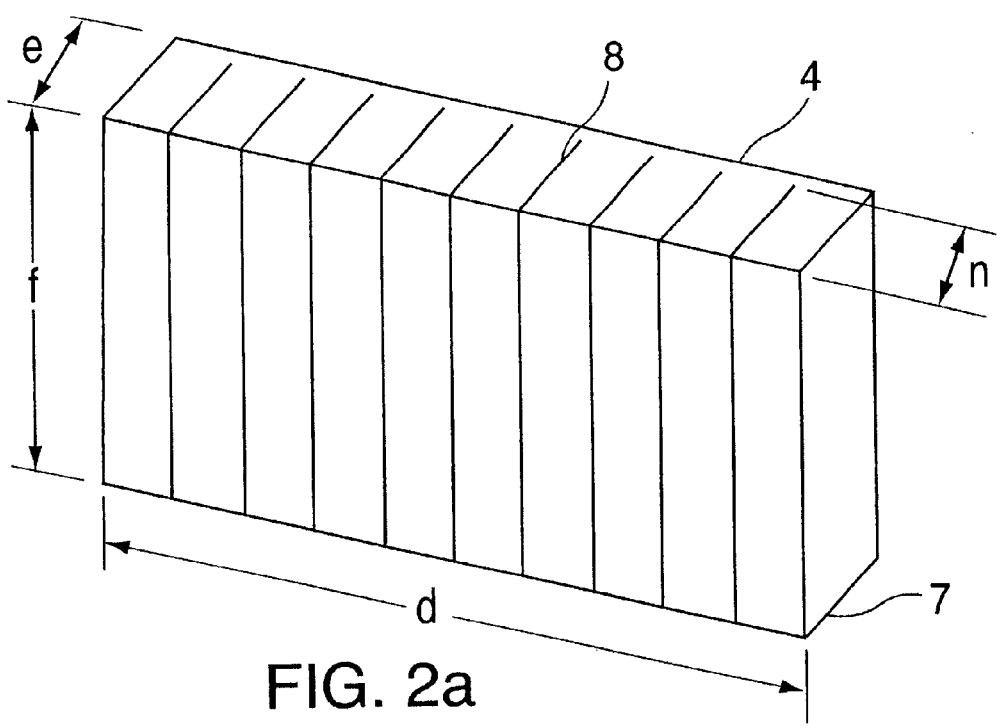
FIG. 2a is a perspective view of a second support structure showing a plurality of second support channels in accordance with an embodiment of the invention.
Figure 2B:
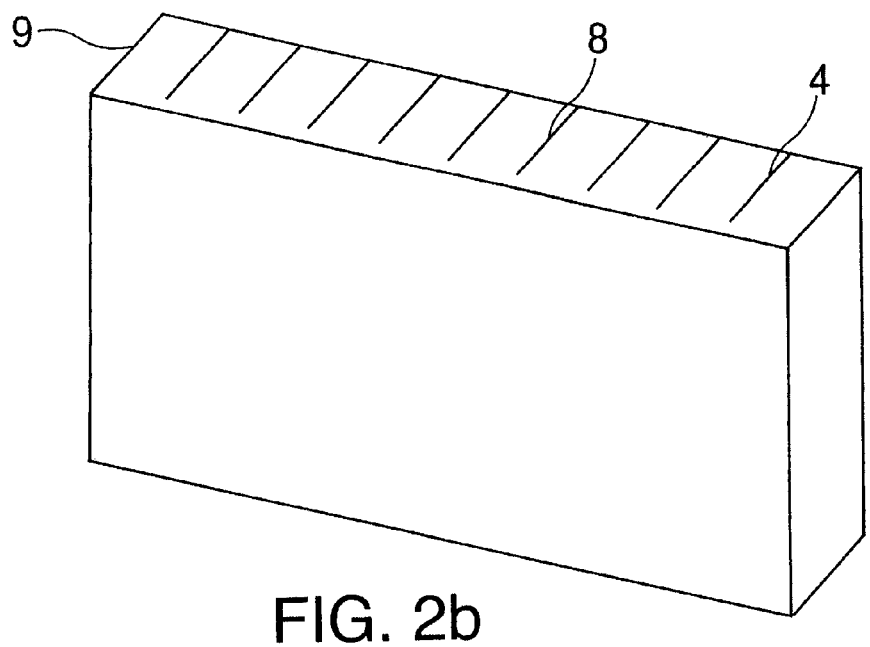
FIG. 2b is a perspective view of a second support structure in accordance with an embodiment of the invention.

Referring to the drawings, FIG. 1a, FIG. 1b, FIG. 2a and FIG. 2b illustrate a first support structure 2 and a second support structure 4 respectively, in accordance with an embodiment of the invention. First support structure 2 preferably includes a first support top 3, a first support bottom 5, a first support length a, a first support width b, a first support height c and at least one first support channel 6. First support channel 6 preferably includes a first support channel depth m and traverses first support height c so as to communicate first support top 3 with first support bottom 5. In accordance with an embodiment of the invention, first support channel depth m may be adjusted as desired, however first support width b is preferably larger than first support channel depth m. First support channels 6 are preferably disposed within first support structure 2 so as to be positioned at regular intervals. First support channels 6 are preferably narrow in width such that when a transmission cable is inserted into first support channel 6, the material of first support structure 2 naturally closes around the transmission cable in a cocooning fashion so as to frictionally interact with the transmission cable. The frictional interaction between the first support structure 2 and the transmission cable acts as a strain relief when the transmission cable experiences a pull force. In accordance with an embodiment of the invention, the width of first support channel 6 may be adjusted to receive various transmission cable sizes. In addition, first support length a, first support width b and first support height c may be chosen so as to receive and frictionally interact with several inches of transmission cable.

Similarly, second support structure 4 preferably includes a second support top 9, a second support bottom 7, a second support length d, a second support width e, a second support height f and at least one second support channel 8. Second support channel 8 preferably includes a second support channel depth n and traverses second support height f so as to communicate second support top 9 with second support bottom 7. In accordance with an embodiment of the invention, second support channel depth n may be adjusted as desired, however second support width e is preferably larger than second support channel depth n. Second support channels 8 are preferably disposed within first support structure 2 so as to be positioned at regular intervals. Second support channels 8 are preferably narrow in width such that when a transmission cable is inserted into second support channel 8, the material of second support structure 4 naturally closes around the transmission cable in a cocooning fashion so as to frictionally interact with the transmission cable. The frictional interaction between the second support structure 4 and the transmission cable acts as a strain relief when the transmission cable experiences a pull force. In accordance with an embodiment of the invention, the width of second support channel 8 may be adjusted to receive various transmission cable sizes. In addition, second support length d, second support width e and second support height f may be chosen so as to receive and frictionally interact with several inches of transmission cable.

In accordance with an embodiment of the invention, the width of first support channel 6 and second support channel 8 should be chosen to accommodate the transmission cable jacket outer diameter so as to prevent the introduction of micro-bending losses or cause crushing of the cable or fiber.

In accordance with an embodiment of the invention first support structure 2 and second support structure 4 are preferably constructed from a material having sufficient strength, rigidity and flexibility characteristics, such as foam and in particular a polyethylene foam. In accordance with and embodiment of the invention, first support structure 2 and second support structure 4 may be constructed from any material or composite known in the art and suitable to the desired end purpose.

Referring to FIG. 3a, FIG. 3b, FIG. 4a and FIG. 4b, a transmission cable strain relief device 1 in accordance with an embodiment of the invention is illustrated and preferably includes a mounting device 10 having a first side 12, a second side 14, a mounting device front 16, a mounting device rear 18, a mounting device top 20 and a mounting device bottom 22. Mounting device top 20 and mounting device bottom 22 are preferably separated by a mounting device height g. In accordance with an embodiment of the invention, mounting device rear 18 includes an elongated portion 34 having a posterior height h, wherein the mounting device height g is preferably larger than posterior height h. However, it is considered within the scope of the invention that posterior height h may be of any height suitable to the desired end purpose, including heights greater than or equal to mounting device height g.

In addition, mounting device 10 preferably includes a first angled portion 24, a second angled portion 26, a third angled portion 28, an angled top portion 30 and an angled bottom portion 32. In accordance with an embodiment of the invention, first angled portion 24 includes a piston handle 40 and a piston 42, wherein piston 42 protrudes from first angled portion 24 and wherein piston 42 is preferably movably associated with piston handle 40 via a resilient device 44 so as to allow piston 42 to be springingly adjusted via piston handle 40. It is considered within the scope of the invention, that resilient device 44 may be any resilient device suitable to the desired end purpose, such as a spring.

Figure 5:
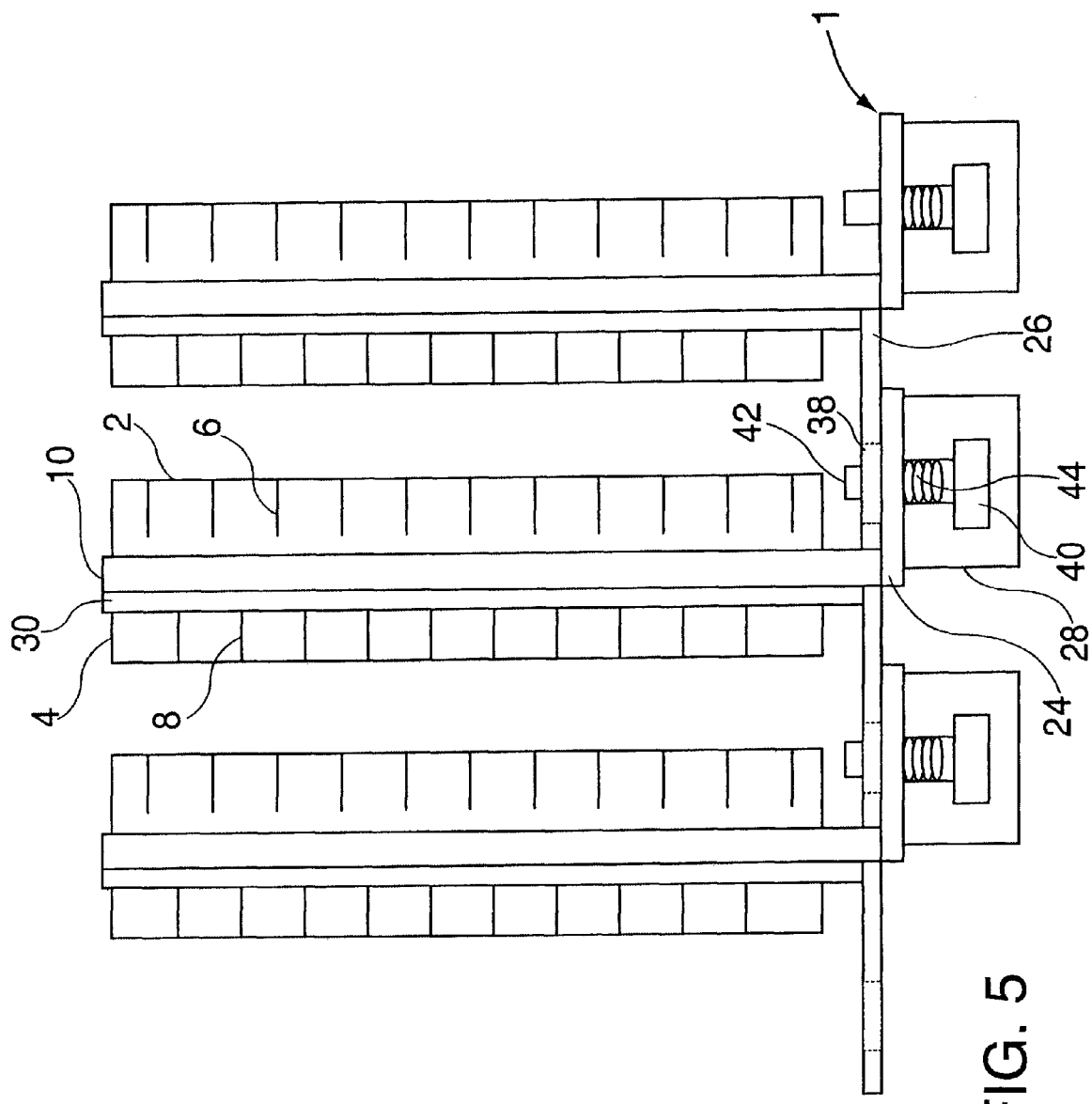
FIG. 5 shows a top view of multiple transmission cable strain relief devices in a cascading fashion in accordance with an embodiment of the invention.

In accordance with an embodiment of the invention, second angled portion 26 preferably includes a piston opening 38, wherein second angled portion 26 and piston opening 38 are disposed so as to allow multiple mounting devices 10 to be cascaded together as shown in FIG. 5. While multiple mounting devices 10 are cascaded together piston opening 38 is disposed so as to receive a piston 42 from an adjacent mounting device 10. In order to cascade multiple mounting devices 10 together, piston handle 40 of a first mounting device 10 is pulled away from the mounting device front 16 so as to cause piston 42 to retract from its protruded position. A second mounting device 10 is then positioned so as to dispose piston opening 38 of second mounting device 10 adjacent to piston 42 of first mounting device 10. Piston handle 40 is then allowed to retract via resilient device 44 such that piston 42 is communicated with and protruding from piston opening 38 of second mounting device 10. This process can then be repeated to cascade multiple mounting devices 10 together.

Third angled portion 28 preferably includes an screw opening 36 for receiving a mounting screw or bolt so as to allow transmission cable strain relief device 1 to be mounted into an equipment support cabinet 46 as shown in FIG. 6 or onto any suitable supporting device, such as a computer chassis. In accordance with an embodiment of the invention, screw opening 36 may be threaded or unthreaded and is preferably disposed so as to be compatible with existing equipment support cabinets 46.

In accordance with an embodiment of the invention, first support structure 2 is nonmovably disposed so as to be adjacent and parallel to first side 12 of mounting device 10 such that first support channel 6 is communicated away from first side 12. In addition, first support structure 2 is preferably disposed such that first support height c is parallel with mounting device height g. Mounting device height g is preferably greater than or equal to first support height c, however mounting device height g and first support height c may be any height suitable to the desired end purpose.

Also, in accordance with an embodiment of the invention, second support structure 4 is nonmovably disposed so as to be adjacent and parallel to second side 14 of mounting device 10 such that second support channel 8 is communicated away from second side 14. In addition, second support structure 4 is preferably disposed such that second support height f is parallel with mounting device height g. Mounting device height g is preferably greater than or equal to second support height f, such that second support height f is disposed beneath angled top portion 30 and above angled bottom portion 32. In accordance with an embodiment of the invention, first support structure 2 and second support structure 4 are preferably nonmovably secured to mounting device 10 using any securing device known in the art and suitable to the desired end purpose, such as epoxy or screws.

Figure 6A:
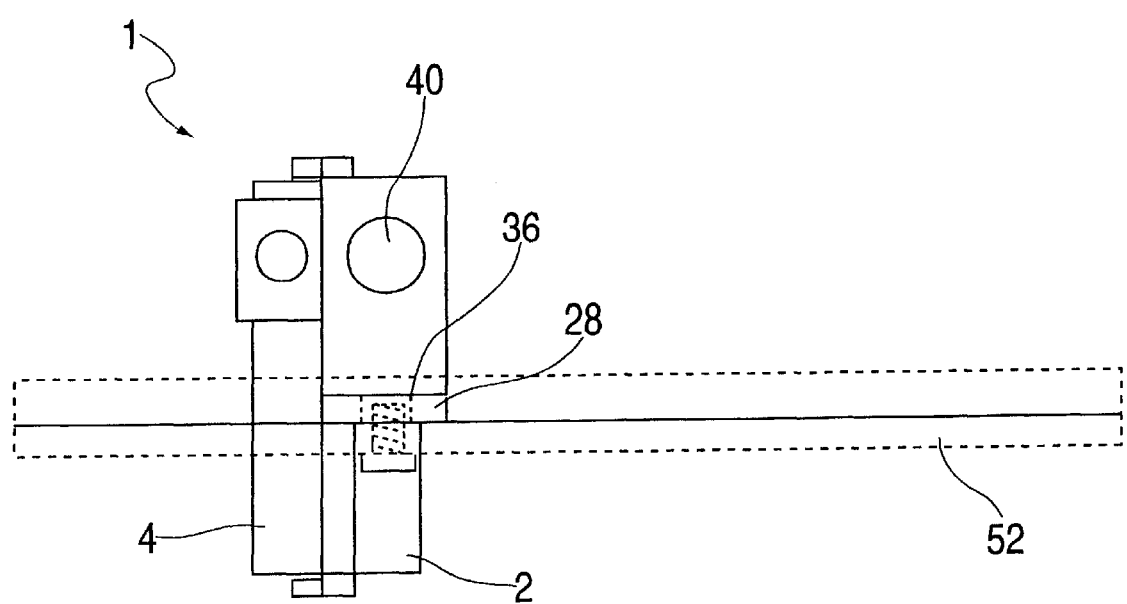
FIG. 6A illustrates front perspective view of a single transmission cable strain relief device mounted into an equipment support cabinet in accordance with an embodiment of the invention.
Figure 6B:
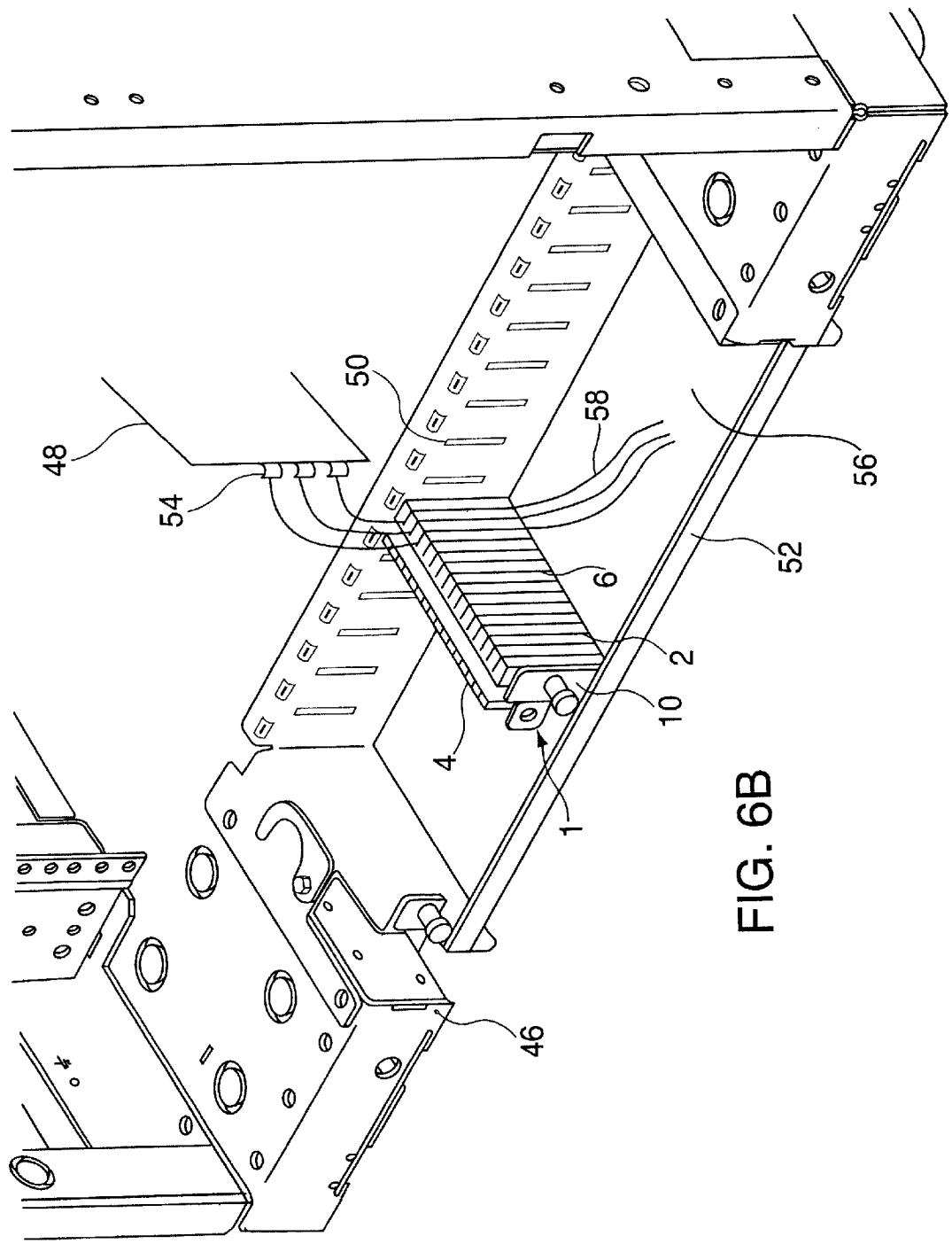
FIG. 6B illustrates a single transmission cable strain relief device mounted into an equipment support cabinet in accordance with an embodiment of the invention.

FIG. 6A and FIG. 6B shows a single transmission cable strain relief device 1 mounted into the frame cutout 56 of a standard equipment support cabinet 46. Equipment support cabinet 46 includes a plurality of receiving slots 50, a support mounting structure 52 and a data input/output card 48 having a plurality of transmission cable connectors 54. Transmission cable strain relief device 1 is mounted into frame cutout 56 by disposing elongated portion 34 within receiving slot 50. Mounting device 10 is then secured to equipment support cabinet 46 by mounting third angled portion 28 to support mounting structure 52 via a securing device being communicated with screw opening 36, wherein any securing device known in the art and suitable to the desired end purpose, such as a bolt or screw, may be used.

In accordance with an embodiment of the invention, a plurality of transmission cables 58 are shown being communicated with transmission cable connectors 54 through frame cutout 56. Each individual transmission cable 58 is communicated with transmission cable strain relief device 1 by threading each individual transmission cable 58 through a single first support channel 6. Transmission cable 58 is disposed within first support channel 6 so as to allow first support structure 2 to completely enclose around transmission cable 58 in a cocoon fashion such that first support structure 2 frictionally interacts with transmission cable 58. If transmission cables 58 are subjected to any pull forces, axial or non-axial, the frictional interaction between the transmission cable and the first support structure 2 will act as a strain relief and protect the transmission cable 58, the transmission cable connectors 54 and the input/output card 48 from being damaged.

It is considered within the scope of the invention that both first support structure 2 and second support structure 4 may be used to accommodate multiple transmission cables simultaneously. However, if both first support structure 2 and second support structure 4 are used for strain relief purposes, first support channels 6 and second support channels 8 should be offset such that opposing channels do not press against each other.

It should be noted that second support channels 8 and first support channels 6 are preferably disposed so as to be offset from each other, as shown in FIG. 5. However, it is considered within the scope of the invention that second support channels 8 and first support channels 6 may be disposed in any manner suitable to the desired end purpose. In addition, first support channels 6 and second support channels 8 are shown as having a relatively straight shape. However, it is further considered within the scope of the invention that first support channels 6 and second support channels 8 may be of any shape suitable to the desired end purpose, such as at various angles or as a serpentine or "S" shape.

It is considered within the scope of the present invention that transmission cable strain relief device 1 may be used with existing equipment support cabinets 46 singly as shown in FIG. 6, or in a cascade fashion as shown in FIG. 5. In addition, transmission cable strain relief device 1 may be used with existing equipment support cabinets 46 or with any standalone equipment that employs a transmission cable.

It is considered within the scope of the present invention, that transmission cable strain relief device 1 may be used with any suitable transmission cables, such as copper cables, fiber optic cables or SFF fiber optic cables.

In accordance with an embodiment of the invention, mounting device 10 may be constructed of any material having sufficient strength and rigidity suitable to the desired end purpose, such as steel, aluminum or composite material.

In accordance with an embodiment of the invention, first support structure 2 and second support structure 4 may be constructed of any material having a sufficient coefficient of friction suitable to the desired end purpose. In addition, first support structure 2 and second support structure 4 may be constructed of any material having sufficient strength, rigidity and flexibility suitable to the desired end purpose.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. A transmission cable strain relief device comprising:
    a first support structure, said first support structure having a first support length, a first support width and a first support height and wherein said first support structure includes at least one first support channel for receiving at least one transmission cable;
    a second support structure, said second support structure having a second support length, a second support width and a second support height and wherein said second support structure includes at least one second support channel for receiving at least one transmission cable; and
    a mounting device, said mounting device having a first side, a second side, a mounting device front, a mounting device rear, a mounting device top and a mounting device bottom, wherein said first support structure is disposed adjacent said first side and wherein said second support structure is disposed adjacent with said second side.

2. A transmission cable strain relief device according to claim 1, wherein said mounting device front includes a first angled portion, a second angled portion and a third angled portion, wherein said third angled portion includes a threaded opening for receiving a mounting screw.

3. A transmission cable strain relief device according to claim 2, wherein said first angled portion includes a piston and a piston handle, wherein said piston and said piston handle are movably coupled with said first angled portion.

4. A transmission cable strain relief device according to claim 3, wherein said second angled portion includes a piston opening for receiving a piston.

5. A transmission cable strain relief device according to claim 1, wherein said mounting device top includes an angled top portion, said angled top portion extending over a portion of said second support structure.

6. A transmission cable strain relief device according to claim 1, wherein said mounting device bottom includes an angled bottom portion, said angled bottom portion extending over a portion of said second support structure.

7. A transmission cable strain relief device according to claim 1, wherein said mounting device top and said mounting device bottom are separated by a mounting device height and wherein said mounting device rear includes an elongated portion having a posterior height, wherein said mounting device height is larger than said posterior height.

8. A transmission cable strain relief device according to claim 1, wherein said first support structure includes a first support top and a first support bottom, wherein said first support channel traverses said first support height so as to communicate said first support top with said first support bottom.

9. A transmission cable strain relief device according to claim 1, wherein said first support channel includes a first channel depth wherein said first support width is larger than said first channel depth.

10. A transmission cable strain relief device according to claim 1, wherein said second support structure includes a second support top and a second support bottom, wherein said second support channel traverses said second support height so as to communicate said second support top with said second support bottom.

11. A transmission cable strain relief device according to claim 1, wherein said second support channel includes a second channel depth wherein said second support width is larger than said second channel depth.

12. A transmission cable strain relief device according to claim 1, wherein said first support structure and said second support structure are constructed of a foam.

13. A transmission cable strain relief device according to claim 1, further comprising a support structure securing means for securing said first support structure to said first side and said second support structure to said second side so as to prevent said first support structure and said second support structure from moving relative to said mounting device.

14. A transmission cable strain relief device according to claim 13, wherein said support structure securing means includes an epoxy.

15. A transmission cable strain relief device according to claim 1, wherein said mounting device is constructed of a rigid material.

16. A transmission cable strain relief device according to claim 1, wherein said mounting device is constructed of a plastic material.

17. A transmission cable strain relief device according to claim 1, wherein said mounting device is constructed of aluminum.

18. A transmission cable strain relief device according to claim 1, wherein said mounting device is constructed of steel.

19. A transmission cable strain relief device according to claim 1, wherein said transmission cable includes fiber optic cables.

20. A transmission cable strain relief device according to claim 1, wherein said transmission cable includes copper cables.

* * * * *